United States Patent
Miura

(10) Patent No.: US 7,510,986 B2
(45) Date of Patent: Mar. 31, 2009

(54) PRODUCTION METHOD FOR SEMICONDUCTOR DEVICE

(75) Inventor: Mineo Miura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 236 days.

(21) Appl. No.: 10/585,108

(22) PCT Filed: Dec. 21, 2004

(86) PCT No.: PCT/JP2004/019662

§ 371 (c)(1),
(2), (4) Date: Jun. 30, 2006

(87) PCT Pub. No.: WO2005/067018

PCT Pub. Date: Jul. 21, 2005

(65) Prior Publication Data

US 2007/0167026 A1 Jul. 19, 2007

(30) Foreign Application Priority Data

Jan. 7, 2004 (JP) .............................. 2004-002259

(51) Int. Cl.
*H01L 21/00* (2006.01)

(52) U.S. Cl. ........................ 438/796; 438/799; 438/522; 257/E21.054; 257/E21.057

(58) Field of Classification Search ................ 438/799, 438/796, 522, 518; 257/E21.054, E21.057
See application file for complete search history.

(56) References Cited

U.S. PATENT DOCUMENTS

| 5,944,890 A * | 8/1999 | Kitou et al. ................... 117/101 |
| 5,981,900 A * | 11/1999 | Flemish et al. .......... 219/121.59 |
| 6,159,884 A * | 12/2000 | Flemish et al. ................. 501/88 |
| 7,390,367 B1 * | 6/2008 | Sumakeris et al. ........... 118/725 |
| 2006/0141808 A1 * | 6/2006 | Granneman et al. .......... 438/799 |
| 2007/0108195 A1 * | 5/2007 | Tian et al. .................... 219/702 |

FOREIGN PATENT DOCUMENTS

| JP | 60-239400 | 11/1985 |
| JP | 11-274481 | 10/1999 |
| JP | 2001-068428 | 3/2001 |
| JP | 2001-158697 | 6/2001 |
| JP | 2003-086816 | 3/2003 |
| JP | 2003-092267 | 3/2003 |

* cited by examiner

*Primary Examiner*—Caridad M Everhart
(74) *Attorney, Agent, or Firm*—Rabin & Berdo, P.C.

(57) ABSTRACT

In a production process for a semiconductor device employing an SiC semiconductor substrate (1), the SiC semiconductor substrate (1) is mounted on a susceptor (23), and a C heating member (3) of carbon is placed on a surface of the SiC semiconductor substrate (1). An annealing process is performed to form an impurity region in the surface of the SiC semiconductor substrate (1) by causing the susceptor (23) and the C heating member (3) to generate heat at high temperatures.

7 Claims, 3 Drawing Sheets

PRODUCTION METHOD FOR SEMICONDUCTOR DEVICE

BACKGROUND OF THE INVENTION

1. Field of the Invention

The present invention relates to a production method for a semiconductor device employing a silicon carbide semiconductor substrate.

2. Description of Related Art

In a production process for a semiconductor device employing a silicon carbide (SiC) semiconductor substrate, an impurity region is formed in a surface of the silicon carbide semiconductor substrate by performing ion implantation and then annealing (heat treatment).

The annealing after the ion implantation is achieved, for example, by mounting the ion-implanted silicon carbide semiconductor substrate on a susceptor of graphite disposed in a quartz tube with the front surface (device formation surface) of the substrate facing up and, in this state, causing the susceptor to generate heat through high frequency induction heating by supplying high frequency power to a coil wound around the outer periphery of the quartz tube. The temperature of the susceptor is 1600 to 1800° C. during the annealing. Ions (impurity) implanted into the front surface of the silicon carbide semiconductor substrate are activated by the heat from the high temperature susceptor.

In the aforementioned annealing method, however, Si atoms in the front surface of the silicon carbide semiconductor substrate are sublimated into the ambient atmosphere. Further, Si atoms or C atoms migrate in the front surface of the silicon carbide semiconductor substrate. As a result, the crystalline structure of SiC is changed, so that the front surface of the silicon carbide semiconductor substrate is disadvantageously roughened.

In another prior-art method for annealing the silicon carbide semiconductor substrate, a cap of silicon carbide is brought into contact with the front surface of the silicon carbide semiconductor substrate mounted on the susceptor and, with the front surface of the silicon carbide semiconductor substrate covered with the cap, the silicon carbide semiconductor substrate is annealed. This method also has the possibility of the roughening of the front surface of the silicon carbide semiconductor substrate. That is, where the silicon carbide cap contacts the front surface of the silicon carbide semiconductor substrate, the sublimation of Si atoms occurs on a higher temperature side. Therefore, if the temperature of the silicon carbide semiconductor substrate is higher than the temperature of the silicon carbide cap, Si atoms in the front surface of the silicon carbide semiconductor substrate are sublimated, so that the SiC crystalline structure in the front surface of the substrate is changed. Further, Si atoms sublimated on the higher temperature side migrate to a lower temperature side. Therefore, if the temperature of the silicon carbide cap is higher than the temperature of the silicon carbide semiconductor substrate, Si atoms are sublimated from the silicon carbide cap, and the sublimated Si atoms adhere to the front surface of the silicon carbide semiconductor substrate. Therefore, the front surface of the silicon carbide semiconductor substrate is liable to be roughened, whichever of the silicon carbide semiconductor substrate and the silicon carbide cap has a higher temperature.

In a method proposed in Japanese Unexamined Patent Publication No. 2001-68428, the annealing is performed with a protective film formed on the front surface of the silicon carbide semiconductor substrate, whereby the roughening of the front surface of the silicon carbide semiconductor substrate and diffusion of impurity (boron) atoms from the front surface of the silicon carbide semiconductor substrate are prevented during the annealing. However, the proposed method is disadvantageous in that the protective film should be removed by plasma etching or the like after the annealing, increasing the number of production process steps and the production costs.

SUMMARY OF THE INVENTION

It is therefore an object of the present invention to provide a semiconductor device production method which prevents the roughening of a front surface of a silicon carbide semiconductor substrate during annealing without increase in the number of production process steps.

An inventive semiconductor device production method is a method for producing a semiconductor device by forming an impurity region in a front surface of a silicon carbide semiconductor substrate, and comprises the steps of bringing a heating member of carbon into contact with the front surface of the silicon carbide semiconductor substrate selectively ion-implanted with an impurity element, and heat-treating the silicon-carbide semiconductor substrate with the heating member in contact with the front surface of the silicon carbide semiconductor substrate.

According to the present invention, the heat treatment (annealing) is performed with the heating member in contact with the front surface of the silicon carbide semiconductor substrate.

If the temperature of the heating member is higher than the temperature of the silicon carbide semiconductor substrate in the heat treatment, sublimation of Si atoms from the front surface of the silicon carbide semiconductor substrate to the heating member does not occur. Carbon of the heating member does not melt at a temperature lower than 3000° C. Therefore, even if the annealing is performed at a relatively high temperature (1600 to 1800° C.), carbon of the heating member does not adhere to the front surface of the silicon carbide semiconductor substrate without fusion and sublimation of carbon from the heating member. Further, migration of Si atoms or C atoms in the front surface of the silicon carbide semiconductor substrate is prevented by reducing a heat treatment period. Therefore, the aforesaid method prevents the roughening of the front surface of the silicon carbide semiconductor substrate without increase in the number of production process steps.

The semiconductor device production method preferably further comprises the step of holding the silicon carbide semiconductor substrate by a susceptor of carbon with a rear surface of the substrate in contact with the susceptor, wherein the heating member contacting step is the step of bringing the heating member into contact with the front surface of the silicon carbide semiconductor substrate held by the susceptor, and the heat treating step is the step of causing the susceptor and the heating member to generate heat through high frequency induction heating for the heat treatment.

According to the present invention, the silicon carbide semiconductor substrate is held by the susceptor, and the heating member is brought into contact with the front surface of the silicon carbide semiconductor substrate. Then, the silicon carbide semiconductor substrate is heat-treated through the high frequency induction heating. That is, the susceptor and the heating member each formed of carbon generate heat through the high frequency induction heating. The heating temperatures of the susceptor and the heating member reach 1600 to 1800° C., so that the impurity element implanted into the front surface of the silicon carbide semiconductor substrate is activated by the heat generated from the susceptor and the heating member.

Where a susceptor of carbon is used as the heating member, the heating member contacting step is preferably the step of holding the silicon carbide semiconductor substrate by the carbon susceptor used as the heating member with the front surface of the substrate in contact with the carbon susceptor.

In this case, the roughening of the front surface of the silicon carbide semiconductor substrate is suppressed without increase in the number of production process steps. That is, the temperature of the susceptor in contact with the front surface of the silicon carbide semiconductor substrate is higher than the temperature of the silicon carbide semiconductor substrate in the heat treatment, so that sublimation of Si atoms from the front surface of the silicon carbide semiconductor substrate to the susceptor does not occur. Carbon of the susceptor does not melt at a temperature lower than 3000° C. Therefore, even if the annealing is performed at 1600 to 1800° C., carbon of the susceptor does not adhere to the front surface of the silicon carbide semiconductor substrate without fusion and sublimation of carbon from the susceptor. Further, migration of Si atoms or C atoms in the front surface of the silicon carbide semiconductor substrate is prevented by reducing the annealing period. This eliminates the possibility of the roughening of the front surface of the silicon carbide semiconductor substrate.

Where a susceptor of carbon is used as the heating member, the heat treating step may be the step of causing the susceptor to generate heat through the high frequency induction heating for the heat treatment or the step of causing a heater built in the susceptor to generate heat for the heat treatment.

The susceptor preferably has a surface coated by high purity carbon CVD or the like. With this arrangement, the silicon carbide semiconductor substrate can be brought into more intimate contact with the susceptor, and contamination of the silicon carbide semiconductor substrate with impurities can be advantageously prevented.

The foregoing and other objects, features and effects of the present invention will become more apparent from the following description of embodiments with reference to the attached drawings.

DESCRIPTION OF THE PREFERRED EMBODIMENTS

Figure 1:
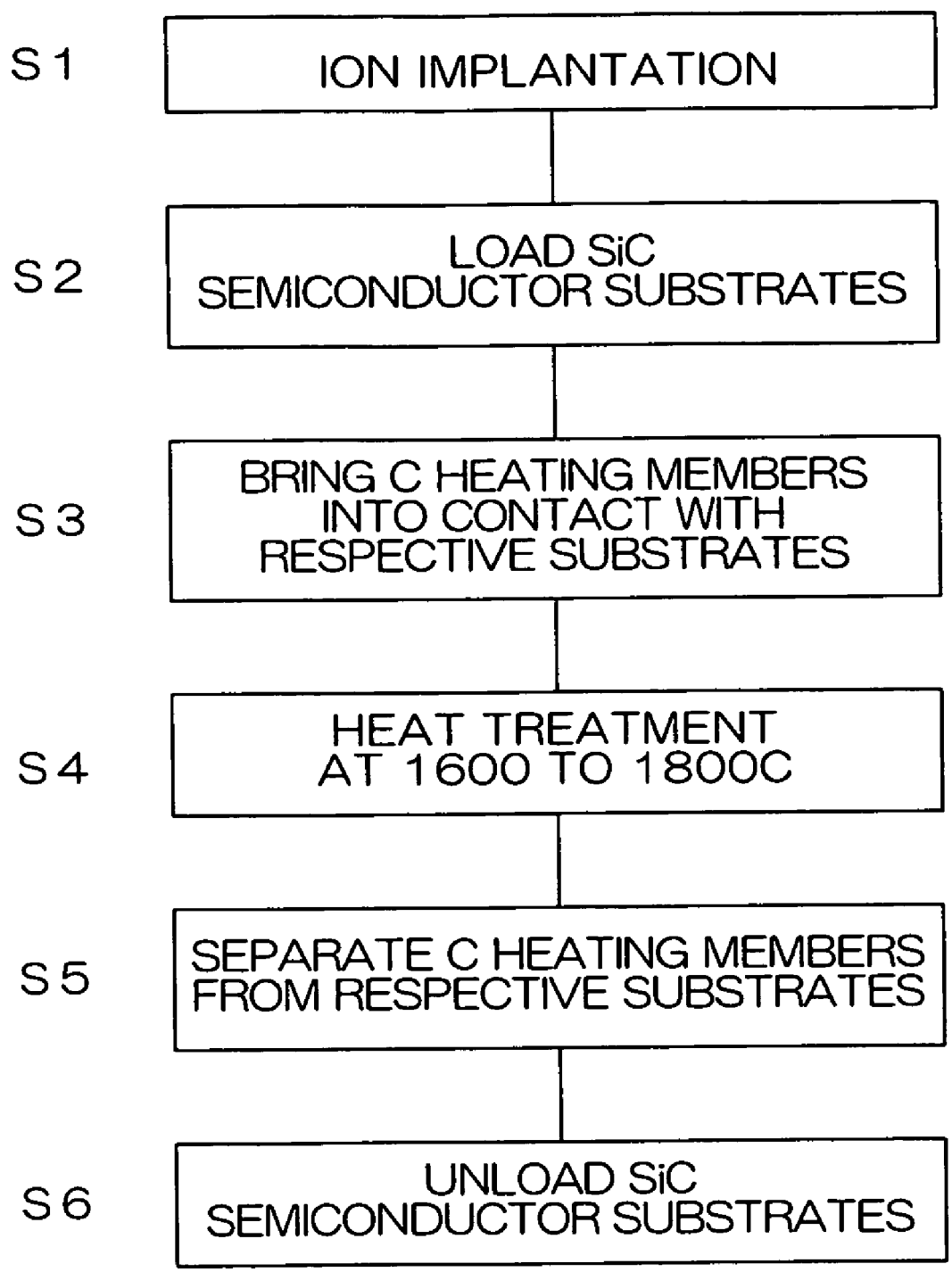
FIG. 1 is a flow chart showing a process sequence included in a semiconductor device production method according to a first embodiment of the present invention.

FIG. 1 is a flowchart showing a process sequence included in a semiconductor device production method according to a first embodiment of the present invention.

Figure 2:
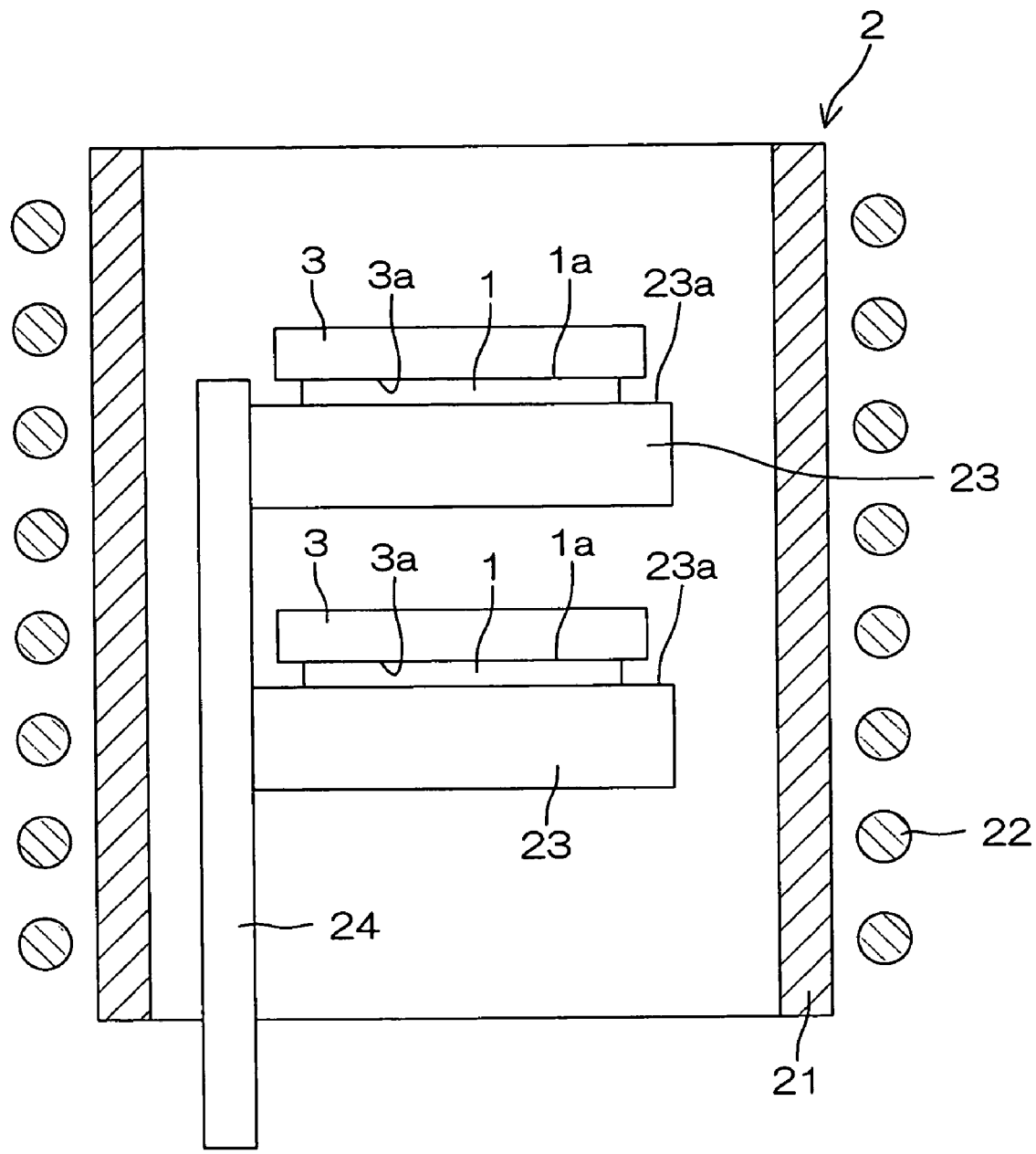
FIG. 2 is a conceptual sectional view for explaining the semiconductor device production method according to the first embodiment of the present invention.

FIG. 2 is a conceptual sectional view for explaining the production method.

This production method is a method for forming an impurity region in a front surface (device formation surface) 1a of an SiC semiconductor substrate 1, and is implemented with the use of a high frequency induction oven 2 for annealing (heat-treating) the SiC semiconductor substrates 1 each ion-implanted with an impurity element.

As shown in FIG. 2, the high frequency induction oven 2 includes a quartz tube 21 having a cylindrical peripheral surface, a high frequency induction heating coil 22 wound around the outer peripheral surface of the quartz tube 21, and a plurality of susceptors 23 each formed of carbon such as graphite. The quartz tube 21 is disposed with its center axis extending generally vertically. The plurality of susceptors 23 are attached to a susceptor support shaft 24 and vertically arranged with a predetermined spacing therebetween. The susceptors 23 are taken into the quartz tube 21 and taken out of the quartz tube 21 by moving the susceptor support shaft 24 up and down with respect to the quartz tube 21.

The impurity element (e.g., phosphorus or boron) is selectively ion-implanted into the front surfaces 1a of the SiC semiconductor substrates 1 (Step S1), and then the SiC semiconductor substrates 1 are loaded in the high frequency induction oven 2 (Step S2). Before the loading of the SiC semiconductor substrates 1, the plurality of susceptors 23 are located outside the quartz tube 21. The SiC semiconductor substrates 1 loaded in the high frequency induction oven 2 are respectively mounted onto upper surfaces 23a of the susceptors 23 with the front surfaces 1a thereof facing up.

Thereafter, carbon heating members (C heating members) 3 are respectively placed on the SiC semiconductor substrates 1 retained (mounted) on the susceptors 23 (Step S3). At least one surface 3a of each of the C heating members 3 is flat, and the flat surfaces 3a of the C heating members 3 are respectively brought into face-to-face contact with the front surfaces 1a of the SiC semiconductor substrates 1. Thus, rear surfaces of the SiC semiconductor substrates 1 are in face-to-face contact with the upper surfaces 23a of the respective susceptors 23, and the flat surfaces 3a of the C heating members 3 are in face-to-face contact with the front surfaces 1a of the respective SiC semiconductor substrates 1.

After the SiC semiconductor substrates 1 are thus respectively retained on the susceptors 23 and the C heating members 3 are respectively brought into face-to-face contact with the front surfaces 1a of the SiC semiconductor substrates 1, the susceptor support shaft 24 is moved up with respect to the quartz tube 21. Thus, the SiC semiconductor substrates 1 respectively retained on the susceptors 23 are loaded into the quartz tube 21. Then, an inert gas such as nitrogen gas or argon gas is introduced into the quartz tube 21, and high frequency power is supplied to the high frequency induction heating coil 22 for annealing the plurality of SiC semiconductor substrates 1 in the inert gas atmosphere (Step S4).

When the high frequency power is supplied to the high frequency induction heating coil 22, a magnetic field is generated in the quartz tube 21. The magnetic field causes induction currents (eddy currents) in the susceptors 23 and the C heating members 3 each formed of carbon, so that the susceptors 23 and the C heating members 3 generate heat. The heating temperatures of the susceptors 23 and the C heating members 3 reach 1600 to 1800° C., thereby achieving high temperature annealing of the SiC semiconductor substrates 1 (Step S4). That is, the susceptors 23 and the C heating members 3 in contact with the front and rear surfaces of the SiC semiconductor substrates 1 are heated to high temperatures on the order of 1600 to 1800° C. through high frequency induction heating, whereby the impurity element implanted into the front surfaces 1a of the SiC semiconductor substrates 1 is activated by heat from the susceptors 23 and the C heating members 3.

At this time, the temperatures of the C heating members 3 in contact with the front surfaces 1a of the SiC semiconductor substrates 1 are higher than the temperatures of the SiC semiconductor substrates 1, so that sublimation of Si atoms from the front surfaces 1a of the SiC semiconductor substrates 1 to the C heating members 3 does not occur. Further, carbon of the C heating members 3 does not melt at a temperature lower than 3000° C. Therefore, carbon of the C heating members 3 does not adhere to the front surfaces 1a of the SiC semiconductor substrates 1 without fusion and sublimation of carbon (C) from the C heating members 3.

The annealing of the SiC semiconductor substrates 1 is performed for a predetermined short period (e.g., 1 second to 10 minutes). The annealed SiC semiconductor substrates 1 are taken out of the quartz tube 21 by moving the susceptor support shaft 24 down with respect to the quartz tube 21, and the C heating members 3 are separated from the front surfaces 1a of the SiC semiconductor substrates 1 (Step S5). Then, the SiC semiconductor substrates 1 are unloaded from the high frequency induction oven 2 (from the susceptors 23).

As described above, the annealing is performed with the C heating members 3 in contact with the front surfaces 1a of the SiC semiconductor substrates 1, whereby the sublimation of Si atoms from the front surfaces 1a of the SiC semiconductor substrates 1 is prevented. Further, carbon from the C heating members 3 does not adhere to the front surfaces 1a of the SiC semiconductor substrates 1. Since the annealing period is short, migration of Si atoms or C atoms in the front surfaces 1a of the SiC semiconductor substrates 1 does not occur. Therefore, the method according to this embodiment prevents the roughening of the front surfaces 1a of the SiC semiconductor substrates 1 without increase in the number of production process steps.

In this embodiment, the annealing of the SiC semiconductor substrates 1 is performed in the inert gas atmosphere. However, the annealing of the SiC semiconductor substrates 1 may be performed in vacuum (or in near-vacuum) by evacuating the quartz tube 21.

The surfaces of the susceptors 23 are preferably coated by high purity carbon CVD. In this case, the SiC semiconductor substrates 1 can be brought into more intimate contact with the susceptors 23, and contamination of the SiC semiconductor substrates 1 with impurities can be further prevented.

Figure 3:
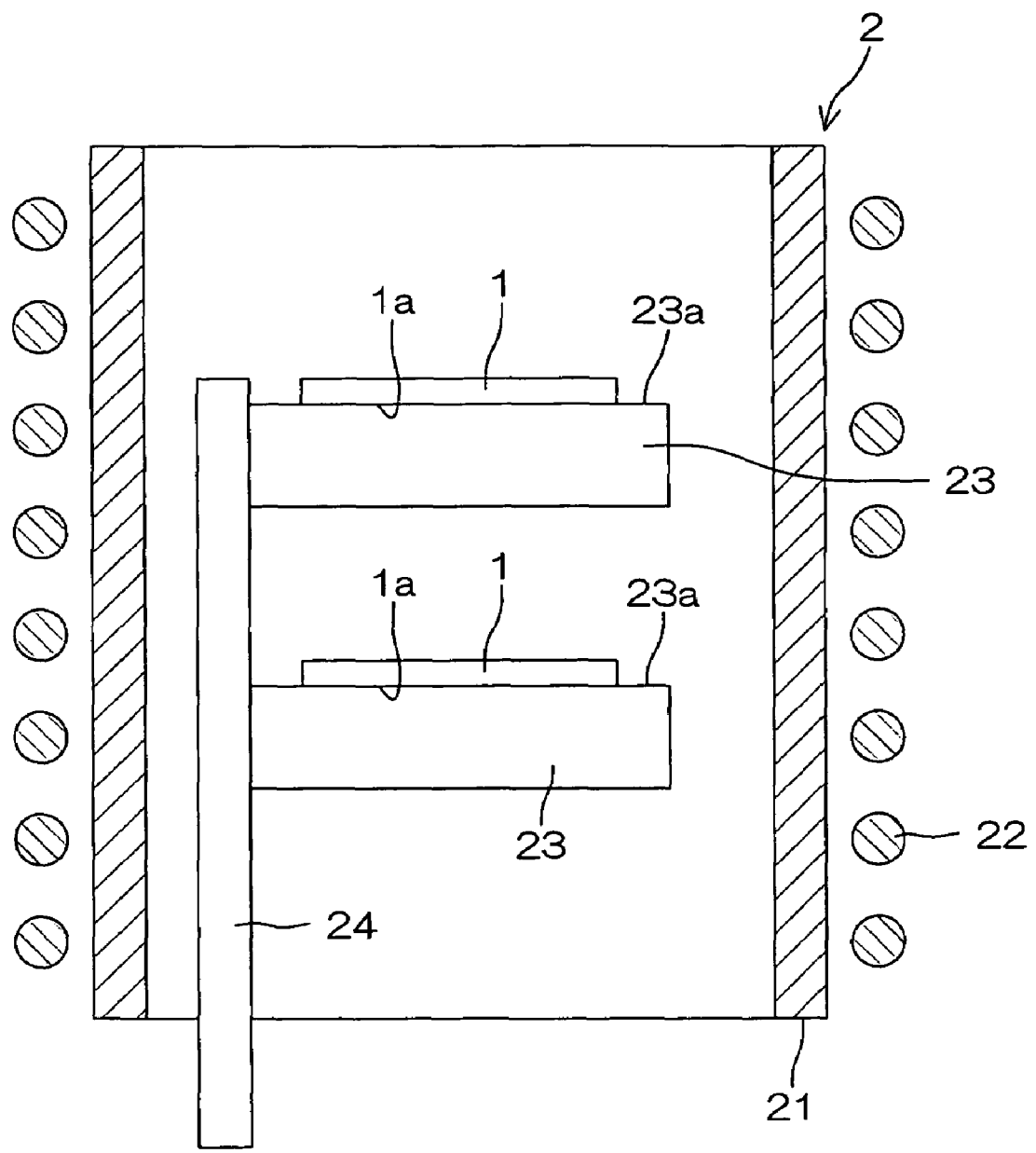
FIG. 3 is a conceptual sectional view for explaining a production method according to a second embodiment of the present invention.

FIG. 3 is a conceptual sectional view for explaining a production method according to a second embodiment of the present invention. In the production method according to this embodiment, the SiC semiconductor substrates 1 are respectively mounted on the upper surfaces 23a of the susceptors 23 with the front surfaces 1a thereof facing down, and annealed in an inert gas atmosphere or in vacuum.

The method according to this embodiment also suppresses the roughening of the front surfaces 1a of the SiC semiconductor substrates 1 without increase in the number of production process steps. That is, the temperatures of the susceptors 23 in contact with the front surfaces 1a of the SiC semiconductor substrates 1 are higher than the temperatures of the SiC semiconductor substrates 1 in the annealing, so that the sublimation of Si atoms from the front surfaces 1a of the SiC semiconductor substrates 1 to the susceptors 23 does not occur. Since carbon of the susceptors 23 does not melt at a temperature lower than 3000° C., carbon of the susceptors 23 does not adhere to the front surfaces 1a of the SiC semiconductor substrates 1 at a temperature of 1600 to 1800° C. without fusion and sublimation of carbon from the susceptor 23. Further, migration of Si atoms or C atoms in the front surfaces 1a of the SiC semiconductor substrates 1 can be prevented by reducing the annealing period (e.g., to 1 second to 10 minutes). Hence, the annealing method according to this embodiment has no possibility of the roughening of the front surfaces 1a of the SiC semiconductor substrates 1.

Further, where the surfaces of the susceptors 23 are coated by high purity carbon CVD, the SiC semiconductor substrates 1 can be brought into more intimate contact with the susceptors 23, and the contamination of the SiC semiconductor substrates 1 with impurities can be further prevented.

While the two embodiments of the present invention have thus been described, the present invention may be embodied in other ways. In the embodiments described above, the annealing of the SiC semiconductor substrates 1 is performed with the use of the high frequency induction oven 2 by way of example. An annealing apparatus having heater-incorporating susceptors of carbon on which the SiC semiconductor substrates 1 are respectively mounted may be used, and the annealing may be performed by causing heaters incorporated in the respective susceptors to generate heat with the front surfaces 1a of the SiC semiconductor substrates 1 in contact with the mount surfaces of the heater-incorporating susceptors. Further, an annealing apparatus having susceptors each adapted for heating by a heating method other than the high frequency induction heating may be used, and the annealing may be performed by heating susceptors with the front surfaces 1a of the SiC semiconductor substrates 1 in contact with the mount surfaces of the susceptors.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2004-2259 filed in the Japanese Patent Office on Jan. 7, 2004, the disclosure of which is incorporated herein by reference.

What is claimed is:

1. A semiconductor device production method for producing a semiconductor device by forming an impurity region in a front surface of a silicon carbide semiconductor substrate, the method comprising the steps of:

holding the silicon carbide seiconductor substrate by a susceptor of carbon with a rear surface of the substrate in contact with the susceptor;

bringing a heating member of carbon into contact with the front surface of the silicon carbide semiconductor substrate selectively ion-implanted with an impurity element; and heat-treating the silicon carbide semiconductor substrate with the heating member in contact with the front surface of the silicon carbide semiconductor substrate, wherein the heating member contacting step is the step of bringing the heating member into contact with the front surface of the silicon carbide semiconductor substrate held by the susceptor, the heat treating step is the step of causing the susceptor and the heating member to generate heat through high frequency induction heating for heat treatment and the susceptor has a surface coated by high purity carbon CVD.

2. A semiconductor device production method for producing a semiconductor device by forming an impurity region in a front surface of a silicon carbide semiconductor substrate, the method comprising the steps of:

bringing a heating member of carbon into contact with the front surface of the silicon carbide semiconductor substrate, the front surface being selectively ion-implanted with an impurity element; and heat-treating the silicon carbide semiconductor substrate with the heating member that is in contact with the front surface of the silicon carbide semiconductor substrate, wherein the heating member contacting step is the step of holding the silicon carbide semiconductor substrate by a susceptor of carbon that serves as the heating member, so that the front surface of the substrate is in contact with the susceptor, and the susceptor has a surface coated by high purity carbon CVD.

3. The semiconductor device production method as set forth in claim 2, wherein the heat treating step is the step of causing the susceptor to generate heat through high frequency induction heating for heat treatment.

4. The semiconductor device production method as set forth in claim 2, wherein the heat treating step is the step of causing a heater built in the susceptor to generate heat for heat treatment.

5. The semiconductor device production method for producing a semiconductor device by forming an impurity region in a front surface of a silicon carbide semiconductor substrate, the method comprising:

holding the substrate by a susceptor comprised of carbon with a rear surface of the substrate in contact with the susceptor;

bringing a heating member comprised of carbon into contact with the front surface of the substrate selectively ion-implanted with an impurity element; and heat-treating the substrate with the heating member and the susceptor.

6. The method of claim 5, wherein, during the heat treating step, the heating member and the susceptor generate heat through high frequency induction heating that uses a magnetic field applied to the heating member and the susceptor, and the heating member and the susceptor heat the substrate by the generated heat.

7. The method of claim 6, wherein, during the heat treating step, a temperature of the heating member is higher than a temperature of the silicon carbide semiconductor substrate, thereby preventing sublimation of atoms from the front surface of the heat the silicon carbide semiconductor substrate.

* * * * *